US010431463B2

(12) United States Patent
Funabashi

(10) Patent No.: US 10,431,463 B2
(45) Date of Patent: Oct. 1, 2019

(54) SUBSTRATE HOLDING DEVICE, LITHOGRAPHY APPARATUS, AND ARTICLE PRODUCTION METHOD

(71) Applicant: CANON KABUSHIKI KAISHA, Tokyo (JP)

(72) Inventor: Naoki Funabashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 747 days.

(21) Appl. No.: 14/963,656

(22) Filed: Dec. 9, 2015

(65) Prior Publication Data

US 2016/0170313 A1  Jun. 16, 2016

(30) Foreign Application Priority Data

Dec. 12, 2014 (WO) .................. PCT/JP2014/082986

(51) Int. Cl.
| | | |
|---|---|---|
| H01L 21/265 | (2006.01) | |
| G03F 7/20 | (2006.01) | |
| H01L 21/67 | (2006.01) | |
| H01L 21/683 | (2006.01) | |
| H01L 21/687 | (2006.01) | |

(52) U.S. Cl.
CPC ............ *H01L 21/265* (2013.01); *G03F 7/707* (2013.01); *G03F 7/70783* (2013.01); *H01L 21/67126* (2013.01); *H01L 21/6838* (2013.01); *H01L 21/68742* (2013.01)

(58) Field of Classification Search
CPC . G03F 7/707; G03F 7/70783; H01L 21/6838; H01L 21/68742
See application file for complete search history.

(56) References Cited

U.S. PATENT DOCUMENTS

| | | | | |
|---|---|---|---|---|
| 5,563,683 A | * | 10/1996 | Kamiya | .................. G03F 7/707 355/53 |
| 2004/0160582 A1 | * | 8/2004 | Lof | ...................... G03F 7/70341 355/30 |
| 2006/0139614 A1 | * | 6/2006 | Owa | ...................... G03B 27/58 355/72 |
| 2007/0152690 A1 | | 7/2007 | Sung | |
| 2008/0111984 A1 | * | 5/2008 | Shibuta | ............... G03F 7/70341 355/72 |
| 2008/0239275 A1 | * | 10/2008 | Mizutani | ............. G03F 7/70341 355/73 |

(Continued)

FOREIGN PATENT DOCUMENTS

| | | |
|---|---|---|
| EP | 0298564 A1 | 1/1989 |
| JP | 05082631 A | 4/1993 |

(Continued)

*Primary Examiner* — Steven Whitesell Gordon
(74) *Attorney, Agent, or Firm* — Canon U.S.A., Inc. I.P. Division

(57) ABSTRACT

A substrate holding device and a lithography apparatus that is advantageous for separation of a substrate from a seal member in a short time when the substrate is carried out. The substrate holding device including a holding member having a center part, an intake hole where air is exhausted from a space between the substrate and the holding member, an outer peripheral part provided at a position lower than the center part to surround the center part, and a seal member in the holding member to define a space.

33 Claims, 6 Drawing Sheets

(56) References Cited

U.S. PATENT DOCUMENTS

| | | | | |
|---|---|---|---|---|
| 2009/0027649 A1* | 1/2009 | De Boer | ................. | G03F 7/707 355/73 |
| 2014/0191478 A1* | 7/2014 | Oremus | ............. | H01L 21/6838 279/3 |
| 2015/0086301 A1* | 3/2015 | Rogers | ................ | H01L 21/6838 414/217 |

FOREIGN PATENT DOCUMENTS

| | | |
|---|---|---|
| JP | H07284716 A | 10/1995 |
| JP | 2001215716 A | 8/2001 |
| JP | 2002217276 A | 8/2002 |
| JP | 2003051535 A | 2/2003 |
| JP | 2006310697 A | 11/2006 |
| JP | 2007158077 A | 6/2007 |
| JP | 2010197415 A | 9/2010 |
| JP | 05305012 B2 | 10/2013 |
| WO | 2006100842 A1 | 9/2006 |

\* cited by examiner

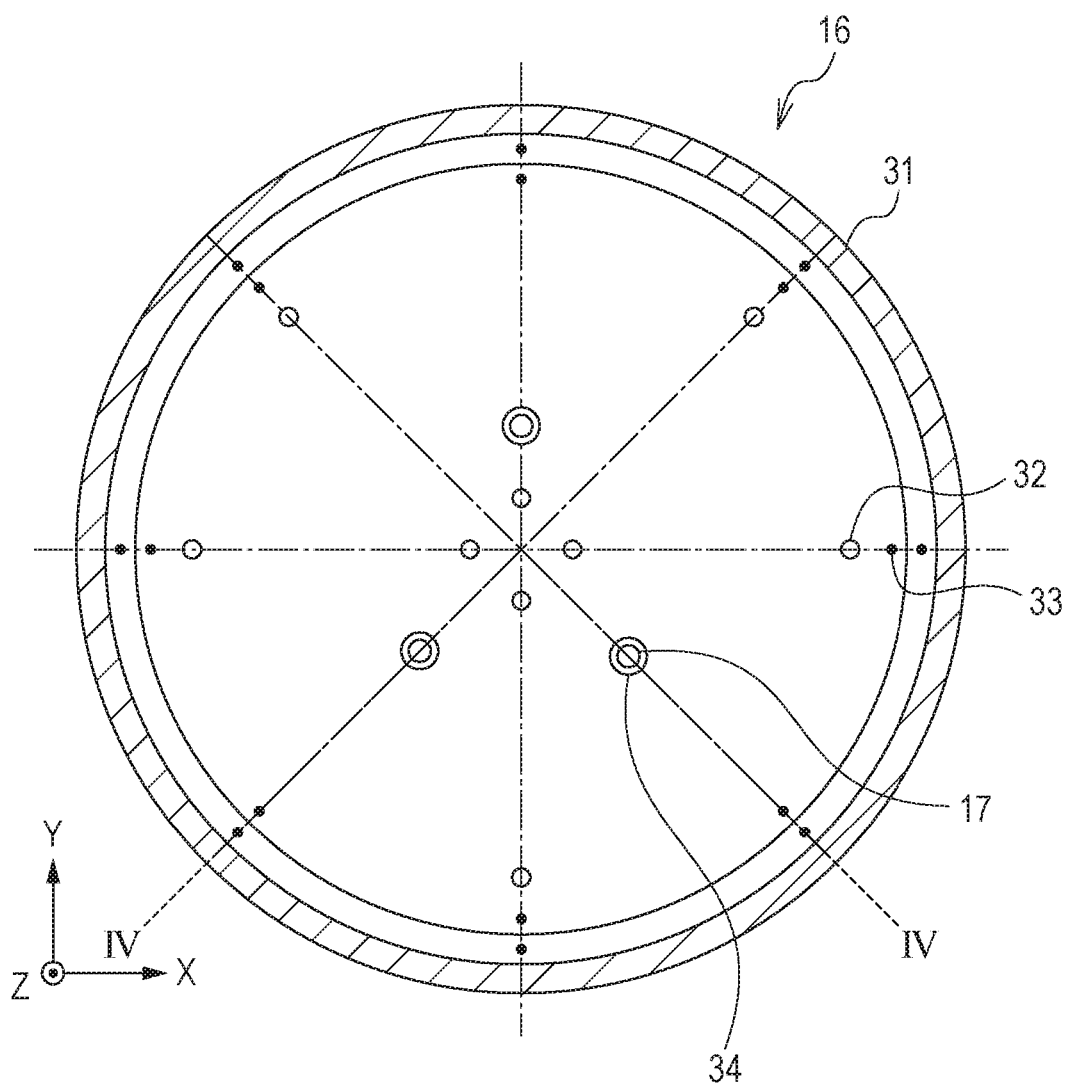

US 10,431,463 B2

SUBSTRATE HOLDING DEVICE, LITHOGRAPHY APPARATUS, AND ARTICLE PRODUCTION METHOD

TECHNICAL FIELD

The present invention relates to a substrate holding device, a lithography apparatus, and an article production method.

BACKGROUND ART

A substrate having unevenness or warpage is sometimes supplied to an exposure apparatus for use in a production method for semiconductor devices and the like. When the substrate is held by vacuum attraction, leakage is caused by warpage of a peripheral edge of the substrate, and this may weaken the attracting force.

PTL 1 and PTL 2 relate to a substrate holding device in which an elastic seal member is provided along an outer periphery of a substrate opposing surface of a holding member. The seal member deforms along the shape of the peripheral edge of the substrate to reduce leakage from a space between the substrate and the substrate opposing surface. This increases the attracting force.

PTL 2 discloses that, in a carry-out operation of a substrate that was subjected to an exposure process, air is jetted out from a hole used to exhaust air from the space so that the substrate easily separates from the seal member.

CITATION LIST

Patent Literature

PTL 1 Japanese Patent Laid-Open No. 2002-217276
PTL 2 Japanese Patent Laid-Open No. 2010-197415

In a substrate holding device described in PTL 2, a pipe connected to holes for exhaust is in a pressure reduced state, and time to replace the inside of the pipe with air is first needed. Since all of the holes are connected to the common pipe, the length of the pipe increases as the distance of the hole connected thereto from the end of the substrate increases. For this reason, although a contact portion between the substrate and the seal member at the end of the substrate most needs air, the supply of air thereto may be delayed.

An aspect of the present invention is to provide a substrate holding device and a lithography apparatus that are advantageous for separation of a substrate from a seal member in a short time when the substrate is carried out.

SUMMARY OF INVENTION

A substrate holding device according to the present invention is a substrate holding device that holds a substrate, and includes a holding member having a center part having an intake hole through which air is exhausted from a space between the substrate and the holding member and an outer peripheral part provided at a position lower than the center part to surround the center part, and a seal member provided in the holding member to define the space. At least one of the outer peripheral part and the seal member has a hole independent of an exhaust system leading to the intake hole.

Further features of the present invention will become apparent from the following description of exemplary embodiments with reference to the attached drawings.

BRIEF DESCRIPTION OF DRAWINGS

FIG. 2 illustrates a chuck according to the first embodiment (when viewed from the vertical upper side).

DESCRIPTION OF EMBODIMENTS

First Embodiment

Figure 1:
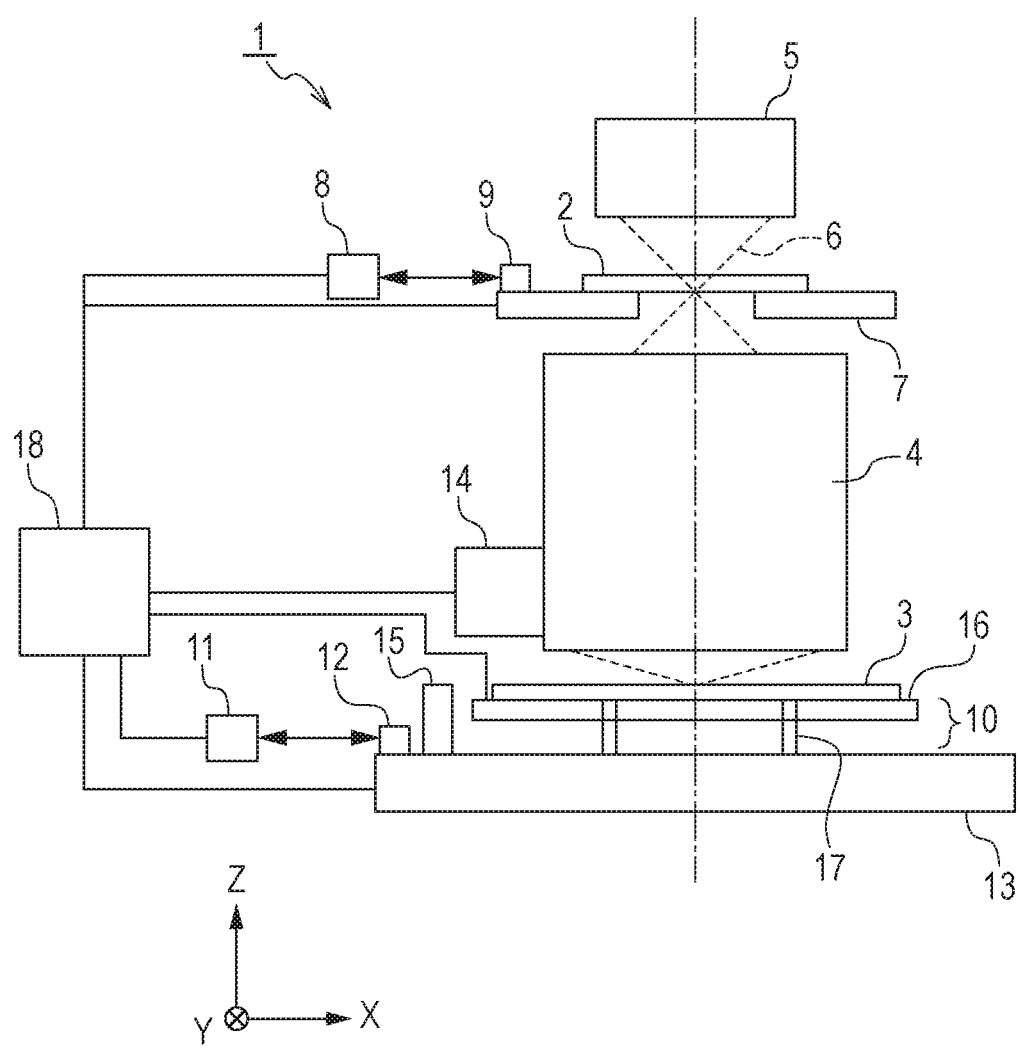
FIG. 1 illustrates an exposure apparatus according to first and second embodiments.

The configuration of an exposure apparatus 1 according to a first embodiment will be described with reference to FIG. 1. The exposure apparatus 1 is a projection exposure apparatus that transfers a pattern (for example, a circuit pattern) formed on a reticle 2 onto a substrate 3 by applying the i-line (wavelength 365 nm) while scanning the reticle 2 and the substrate 3 by a step-and-repeat method. In FIG. 1, the axis parallel to the optical axis of a projection optical system 4 (the vertical direction in the embodiment) is referred to as a Z-axis. In a plane perpendicular to the Z-axis, the direction in which the reticle 2 is scanned during exposure is referred to as an X-axis, and a non-scanning direction orthogonal to the X-axis is referred to as a Y-axis.

Illumination light (beam) 6 shaped by an illumination optical system 5 is applied onto the substrate 3 via the reticle 2 and the projection optical system 4. The substrate 3 is, for example, a single-crystal silicon substrate, and a surface thereof is coated with a resist. The reticle 2 moves together with a stage 7. An interferometer 8 detects the position of the stage 7 by irradiating a mirror 9 with a laser beam and receiving reflected light therefrom. The stage 7 includes a stage top plate (not illustrated) for the reticle and a moving mechanism (not illustrated) for moving the stage top plate for the reticle.

The substrate 3 moves in six axial directions together with a holding device 10 for holding the substrate 3 by vacuum attraction and a stage 13. An interferometer 11 detects the position of the stage 13 with a mirror 12 by a method similar to the method for detecting the position of the stage 7. The stage 13 includes a stage top plate (not illustrated) for the substrate and a moving mechanism (not illustrated) for moving the stage top plate for the substrate.

A detection system 14 detects an alignment mark (not illustrated) formed on the substrate 3 and a reference mark (not illustrated) formed on a mark table 15 set on the stage 13. The detection system 14 detects the positions of the alignment mark and the reference mark, and a control unit 18 to be described later determines a pattern forming position. As the detection system 14, an off-axis alignment detection system for detecting the alignment mark and the reference mark not via the projection optical system 4 is adopted.

The holding device (substrate holding device) 10 includes a chuck (holding member) 16 for holding the substrate 3, pins 17 for supporting the substrate 3 when the substrate 3 is carried in and carried out, and a lifting mechanism (not illustrated) for moving the chuck 16 up and down in the Z-axis direction. By the up and down movement of the chuck 16, the substrate 3 is delivered from the pins 17 to the chuck 16 when carried in and is delivered from the chuck 16 to the pins 17 when carried out. The structure of the holding device 10 will be described in detail later.

The control unit 18 is connected to the stages 7 and 13, the detection system 14, the interferometers 8 and 11, and the holding device 10 via lines, and integratedly controls these units. For example, at the time of exposure, the control unit 18 determines the pattern forming position on the basis of the detection result of the detection system 14, and controls the motions of the stages 7 and 13 on the basis of positional information obtained from the interferometers 8 and 11. When the substrate 3 is carried in and carried out, the control unit 18 controls the motions of the lifting mechanism of the chuck 16 and the stage 13. The control unit 18 may be structured inside a housing that stores constituent members other than the control unit 18, or may be structured in another housing different from the above housing.

Next, the structure of the holding device 10 will be described. FIG. 2 illustrates the holding device 10 when viewed from the +Z-direction. The holding device 10 has the chuck 16 that is circular when viewed from the +Z-direction. The chuck 16 has attraction holes (intake holes) 32, open holes (through holes) 33, and pin holes 34 arranged concentrically.

The pin holes 34 are provided to penetrate three portions near the center of the chuck 16. When the lifting mechanism moves the chuck 16 in the −Z-direction, the pins 17 stick out from the inner sides of the pin holes 34, and the pins 17 serve as support members for the substrate 3 when the substrate 3 is carried in an carried out. When the substrate 3 is attracted, leakage does not occur because the gaps between the pins 17 and the pin holes 34 are closed by a seal member (not illustrated) or the like.

The attraction holes 32 are provided at four positions on the center side of the chuck 16 and at five positions on the outer periphery of the four attraction holes 32. The attraction holes 32 lead to a pipe 35 (illustrated in FIG. 3) and an unillustrated vacuum pump. The pipe 35 and the vacuum pump serve as an exhaust system.

The open holes 33 are provided on the further outer periphery of the attraction holes 32 and around two circumferences each including eight open holes 33. An annular lip seal (seal member) 31 is fixed to the chuck 16 along the outer rim of the chuck 16.

Figure 3A:
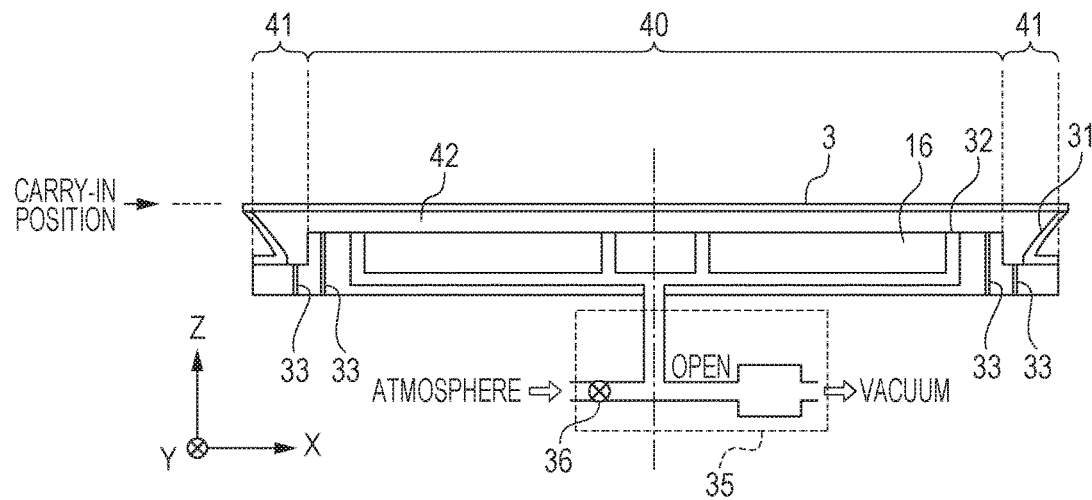
FIGS. 3A and 3B illustrate the chuck according to the first embodiment (when a substrate is attracted).
Figure 3B:
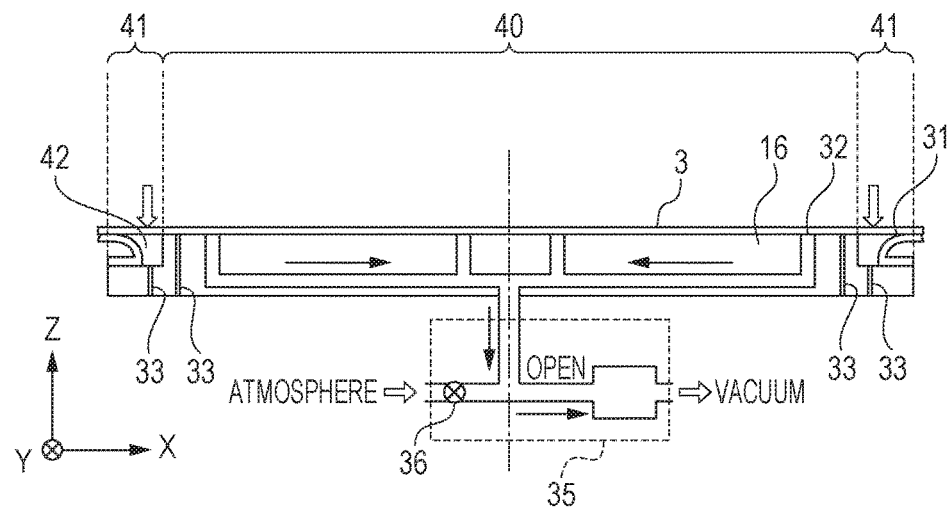

Operations from an operation of carrying in the substrate 3 to an operation of starting exposure will be described with reference to FIGS. 3A and 3B. FIGS. 3A and 3B are cross-sectional views taken along the X-Z plane passing through the center of the chuck 16.

FIG. 3A illustrates a state in which the substrate 3 has been carried into a substrate carry-in position at a height position where the substrate 3 is placed on the holding device 10 above the chuck 16 before the start of exhaust. The range of a space 42 between the substrate 3 and the chuck 16 (a space relative to the substrate) is defined by being surrounded by the lip seal 31.

The chuck 16 includes a center part 40 that comes into contact with the substrate 3 when the substrate 3 is attracted, and an outer peripheral part 41 that surrounds the center part 40 and is provided at a position lower than the center part 40. That is, the distance from the substrate carry-in position to a surface of the outer peripheral part 41 is longer than the distance from the substrate carry-in position to a surface of the center part 40. The lip seal 31 is disposed in the outer peripheral part 41. The center part 40 may include a plurality of pins (not illustrated) provided to reduce the contact area with the substrate 3 and an annular convex structure (not illustrated) for supplementarily sealing the space 42.

The attraction holes 32 are provided in the surface of the center part 40. The attraction holes 32 are integrated into one exhaust channel including a pipe 35 inside the chuck 16, and are connected to the pipe 35 on a lower side of the chuck 16. A valve 36 is provided in the pipe 35 that connects the attraction holes 32 and the vacuum pump. Air inside the space 42 can be exhausted when the substrate 3 is attracted, and air can be supplied to the vertical upper side of the center part 40 when the substrate 3 is carried out.

As illustrated in FIG. 3A, the open holes 33 are provided to penetrate the chuck 16 in the vertical direction (a direction along the thickness direction of the holding member). One-side apertures of the open holes 33 are open to the space 42 and the other-side apertures are open to the atmosphere space, and the open holes 33 serve as air passages independent of the pipe 35 serving as the exhaust system. Since some air leaks owing to the open holes 33, the diameter of the open holes 33 is set to be smaller than the diameter of the attraction holes 32.

FIG. 3B illustrates a state in which the substrate 3 is attracted by the chuck 16 after exhaust starts. As air is exhausted from the space 42, the pressure inside the space 42 decreases, and the lip seal 31 deforms in response to the position change of the substrate 3.

The lip seal 31 is fixed to the outer peripheral part 41 with a fixing material such as an adhesive sheet. A distal end of an unfixed side contacts at a position along the outer periphery of the substrate 3. When the lip seal 31 deforms in association with attraction of the substrate 3, the space 42 surrounded by the chuck 16, the lip seal 31, and the substrate 3 is brought into a sealed state.

For this reason, the lip seal 31 is preferably formed by an expandable and soft member that is easy to deform. Although a polymer material (an elastic polymer material) containing synthetic rubber, such as silicon rubber or fluororubber (a material containing a fluorine compound), is preferably used, other soft resins and metal materials may be used.

Thus, as the attracting force of the holding device 10 increases, the substrate 3 receives the atmospheric pressure and is attracted along the center part of the chuck 16. This can conduct surface correction on the substrate 3. Even when the rim of the substrate 3 is warped, the warp can be corrected.

The exposure apparatus 1 performs exposure in a state in which the substrate 3 is attracted on the chuck 16 by the holding device 10. After the exposure, the holding device 10 is controlled so that the substrate 3 can be carried out.

Figure 4A:
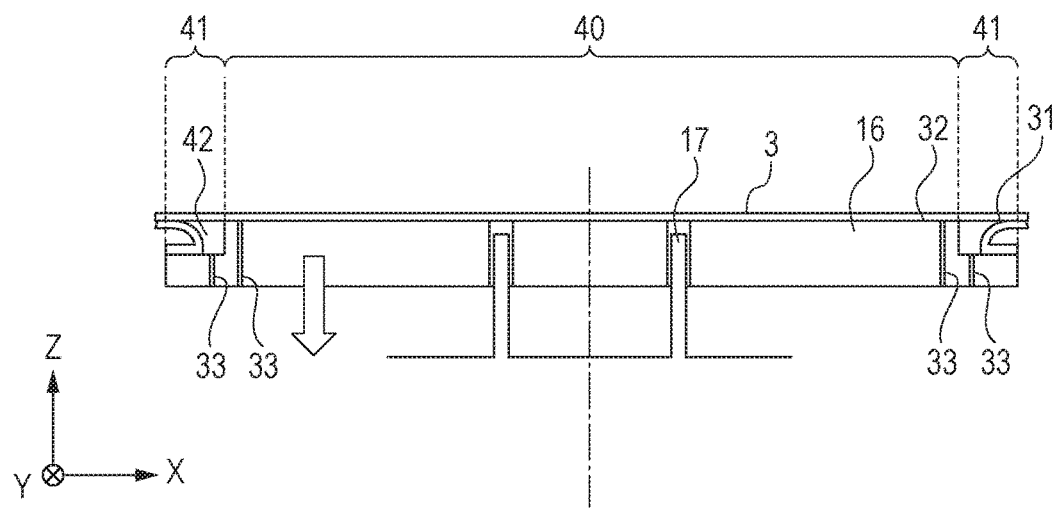
FIGS. 4A and 4B illustrate the chuck according to the first embodiment (when the substrate is carried out).
Figure 4B:
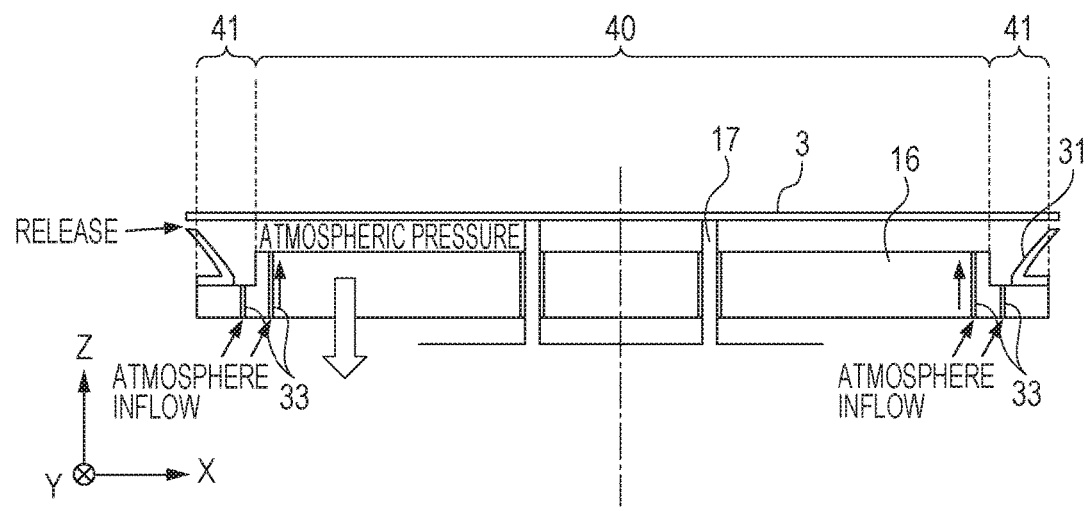

A carry-out operation for the substrate 3 will be described with reference to FIGS. 4A and 4B. FIG. 4A is a cross-sectional view of the chuck 16 taken along a dotted line IV-IV of FIG. 2. When the lifting mechanism moves the chuck 16 downward, the substrate 3 is delivered from the surface of the chuck 16 to the pins 17, and the pins 17 relatively stick out from the chuck 16. Since the volume of the space 42 increases along with the downward movement of the chuck, the pressure in the space 42 becomes a negative pressure with respect to the atmospheric pressure.

When the atmosphere is introduced into the space 42 by opening the above-described valve 36, the attracting force for the substrate 3 decreases. Further, the amount of atmosphere flowing from the open holes 33 into the space 42 increases along with the change in internal pressure of the space 42, as illustrated in FIG. 4B.

The presence of the open holes 33 allows the atmosphere to be positively introduced into the space on the vertical upper side of the outer peripheral part 41 including a contact portion between the substrate 3 and the lip seal 31 and having the largest volume of the exhaust space. The air passages via the open holes 33 are short and are not the space from which air is exhausted by the vacuum pump unlike the pipe 35. Hence, air can be supplied in a short time. Thus, the substrate 3 can be separated from the lip seal 31 in a short time.

When the atmosphere is introduced by using only the attraction holes 32 on the center part 40, much time takes to introduce the air onto the outer peripheral part that occupies most of the space 42. Even when the carry-out operation is promoted by merely increasing the force for jetting the atmosphere, the substrate 3 comes off and slips upon separating from the lip seal 31, and the substrate 3 may be displaced or the substrate 3 may fall onto the floor or the like. If the displaced substrate 3 is carried out as it is, it may be hit during the carrying operation with a transport robot (not illustrated).

In contrast, in a case where the open holes 33 are connected to the exhaust system so that they also have a function as attraction holes, a long pipe is disposed inside the chuck 16 in a complicated form. This may impose arrangement constraints on other members such as a cooling pipe, and may increase the thickness of the chuck 16.

When air is supplied from the attraction holes 32 and the open holes 33 when carrying out the substrate 3 in a state in which the open holes 33 are connected to the exhaust system, a pressure distribution is likely to be produced inside the space 42 owing to the length of the pipe. When the internal pressure becomes high in the center part and the substrate 3 separates from the lip seal 31, the substrate 3 comes off and slips in the instant of separating from the lip seal 31. Then, the substrate 3 may be displaced or the substrate 3 may fall onto the floor or the like. From the above, the open holes 33 independent of the exhaust system are preferably provided in the outer peripheral part. Further, the open holes 33 may be preferably through holes provided in the thickness direction of the chuck 16 for ease of working.

The open holes 33 in this embodiment allow the required amount of atmosphere to be supplied to the space 42 according to the pressure difference between the space 42 and the atmosphere space. In particular, the open holes 33 are preferably provided on at least the outer peripheral part 41 to efficiently supply the atmosphere to the contact portion between the lip seal 31 and the substrate 3 so that the lip seal 31 and the substrate 3 press-bonded to each other are separated in a short time. Further, the air can be supplied in a short time by making the open holes 33 independent of the exhaust system and shortening the air passages from the atmosphere space to the space 42.

Although the amount of air that can be supplied into the space 42 increases as the diameter of the open holes 33 increases, the attracting force might be decreased by leakage from the space 42 while the substrate 3 is held. For this reason, the sum of the cross-sectional areas of the open holes (second hole) 33 provided in the center part 40 and the open holes (first hole) 33 provided in the outer peripheral part 41 is preferably 0.03% or less of the cross-sectional area of the space 42 in the direction along the substrate holding surface. The sum is more preferably within the range of 0.0005% to 0.004%. This can achieve both suppression of leakage during attraction of the substrate 3 and shortening of the time taken to carry out the substrate 3.

The substrate holding surface means a substrate-side surface of the center part 40, and the cross-sectional area of the space 42 in the direction along the substrate holding surface means the cross-sectional area of a plane defined by the inner diameter of the lip seal 31.

Further, at least a distal end portion of the lip seal 31 (for example, a portion corresponding to ⅓ of the height from the distal end of the lip seal 31) is preferably formed of a material having low adhesiveness so that the substrate 3 easily separates from the lip seal 31. For example, the above-described fluororubber (a material containing a fluorine compound) may be used as the lip seal 31, or at least the distal end portion may be coated with a material having low adhesiveness such as PTFE or molybdenum disulfide.

The substrate 3 is easily separated from the lip seal 31 by decreasing the adhesiveness. This can reduce the time taken until carrying-out. Further, wear of the surface of the lip seal 31 in the contact portion with the substrate 3 can be reduced and the durability life of the lip seal 31 can be extended. Moreover, particles produced by wear can be prevented from scattering inside the apparatus.

Example

An example of the first embodiment will be described. In this example, a substrate 3 having a diameter of 300 mm was used. As the chuck 16, a chuck having open holes 33 and a chuck having no open holes 33 were prepared. In the chuck 16 having the open holes 33, the open holes 33 were formed to have a diameter of 0.3 mm so that the total cross-sectional area became 1.5 mm$^2$.

A carry-out operation was repeated while changing the descending speed of the chuck 16 after the substrate 3 came into contact with the pins 17, and the descending speed at which displacement of the substrate 3 occurred was compared. The descending speed of the chuck 16 until the substrate 3 was delivered from the center part 40 to the pins 17 was common to both the chucks.

As result, in the chuck having no open holes 33, displacement of the substrate 3 was confirmed when the descending speed of the chuck was 0.2 mm/s or more at the time of delivering to the pins 17. In contrast, in the chuck 16 having the open holes 33, even when the descending speed of the chuck 16 was 1.0 mm/s, little displacement of the substrate 3 was confirmed.

Contribution to productivity is calculated when the descending distance of the chuck 16 from when the substrate 3 comes into contact with the pins 17 and until when the substrate 3 separates from the lip seal 31 is set at 1 mm. When the descending speed of the chuck 16 can be set at 1.0 mm/s owing to the presence of the open holes 33, the carry-out process per one substrate 3 is speeded up by four seconds. Converting into the throughput, the process speed is 150 substrates/h in the chuck having no open holes 33, whereas the process speed is 180 substrates/h in the chuck having the open holes 33. That is, productivity is enhanced by 30 substrates.

Second Embodiment

Figure 5:
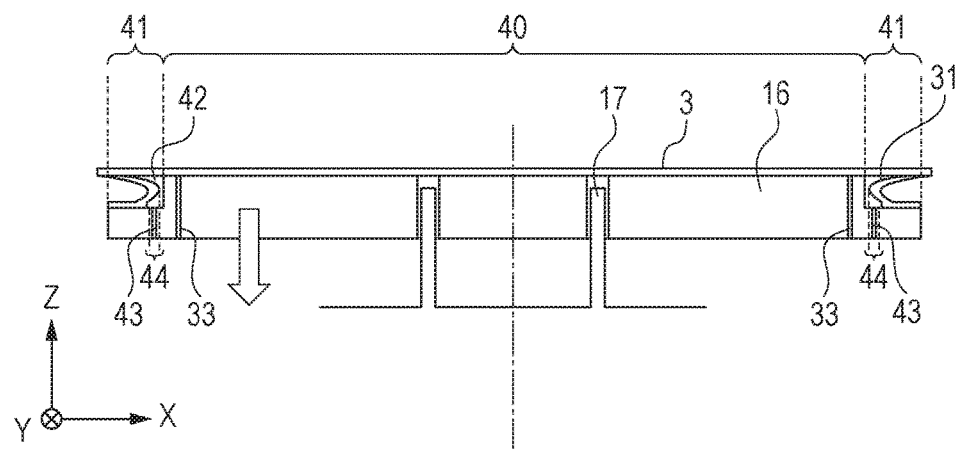
FIG. 5 illustrates a chuck according to the second embodiment.

FIG. 5 is a cross-sectional view of a chuck 16 according to a second embodiment. Open holes 43 are provided at a position (a lead-in area of a seal member) 44, which is closed by a lip seal 31 led into a space 42 when a substrate 3 is attracted, of a substrate opposing surface in an outer peripheral part. This provides an effect of reducing leakage from the open holes 43 during attraction of the substrate 3.

In a carry-out operation, since the lip seal 31 returns to its original shape and the open holes 43 are opened, the atmosphere can be supplied into the space 42. Thus, it is possible to achieve both the effect of suppressing leakage when the substrate 3 is attracted and the effect of shortening the time taken to carry out the substrate 3.

Third Embodiment

Figure 6:
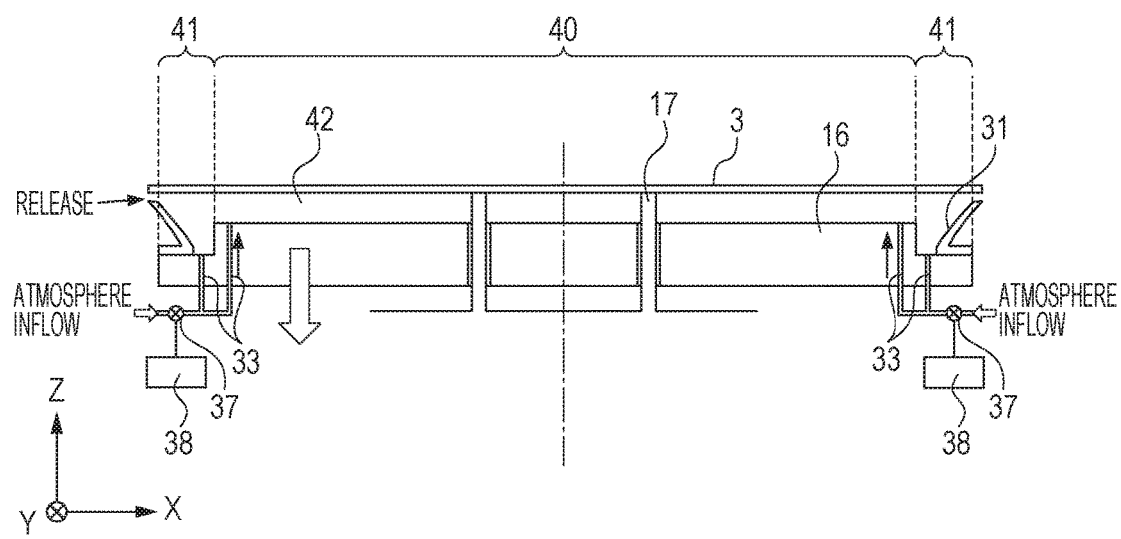
FIG. 6 illustrates a chuck according to a third embodiment.

FIG. 6 is a cross-sectional view of a chuck 16 according to a third embodiment. Open holes 33 that are not connected to a pipe 35 leading to a vacuum pump are provided in a center part 40 and an outer peripheral part 41. Valves 37 formed by openable and closable electromagnetic valves are provided in a pipe leading to the open holes 33, and a control unit 38 connected to the valves 37 controls the opening and closing of the valves 37. Other structures are similar to those of the chuck 16 of the first embodiment. The control unit 38 closes the valves 37 when a substrate 3 is attracted, and opens the valves 37 when the substrate 3 is carried out.

The length of the pipe that should be subjected to replacement with air during carry-out of the substrate 3 in order to supply the atmosphere from the open holes 33 is shorter than when the pipe is connected to the vacuum pump. For this reason, the substrate 3 can be separated from a lip seal 31 in a short time when the substrate 3 is carried out. Further, the inflow of the atmosphere into the space 42 via the open holes 33 can be suppressed during attraction of the substrate 3.

Fourth Embodiment

Figure 7:
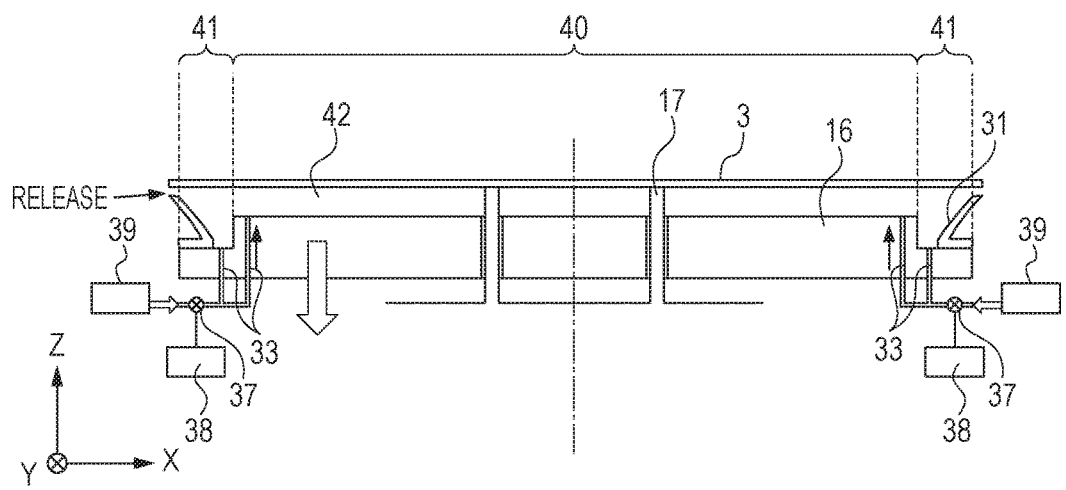
FIG. 7 illustrates a chuck according to a fourth embodiment.

FIG. 7 is a cross-sectional view of a chuck 16 according to a fourth embodiment. In a center part 40 and an outer peripheral part 41, open holes 33 are provided so as not to be connected to a pipe 35 leading to a vacuum pump. Valves 37 serving as openable and closable electromagnetic valves are provided between the open holes 33 and supply sources (gas supply sources) 39 for compressed air, and control units 38 connected to the valves 37 control the opening and closing of the valves 37. Other structures are similar to those adopted in the chuck 16 of the first embodiment.

A pressure sensor (not illustrated) detects the pressure inside a space 42, and the control units 38 control the flow rate of air (gas) passing through the holes 33 on the basis of the detection result. The control units 38 have a function as a flow-rate control unit.

Compressed air allows the atmosphere to be efficiently supplied. Moreover, since the control units 38 supply the atmosphere while adjusting the flow rate, the pressure inside the space 42 is prevented from becoming higher than the atmospheric pressure. This can prevent the substrate 3 from coming off and being displaced when the substrate 3 separates from the lip seal 31. A transport robot (not illustrated) can be prevented from hitting or dropping the substrate 3 in the carrying operation when the substrate 3 is carried out in the displaced state.

The length of the pipe that should be subjected to replacement with air when the substrate 3 is carried out in order to supply the atmosphere from the open holes 33 is shorter than when the pipe is connected to the vacuum pump. For this reason, the substrate 3 can be separated from the lip seal 31 in a short time when carried out.

The pressure sensor is not essential. The control units 38 may control the pressure of air to be supplied to the space 42 on the basis of the expansion degree of air in the space 42 calculated from a predetermined descending speed of the chuck 16. In preparation for a case in which the pressure inside the space 42 becomes higher than the atmospheric pressure, a valve (not illustrated) for letting air outside may be provided on the chuck 16.

Other Embodiments

Figure 8:
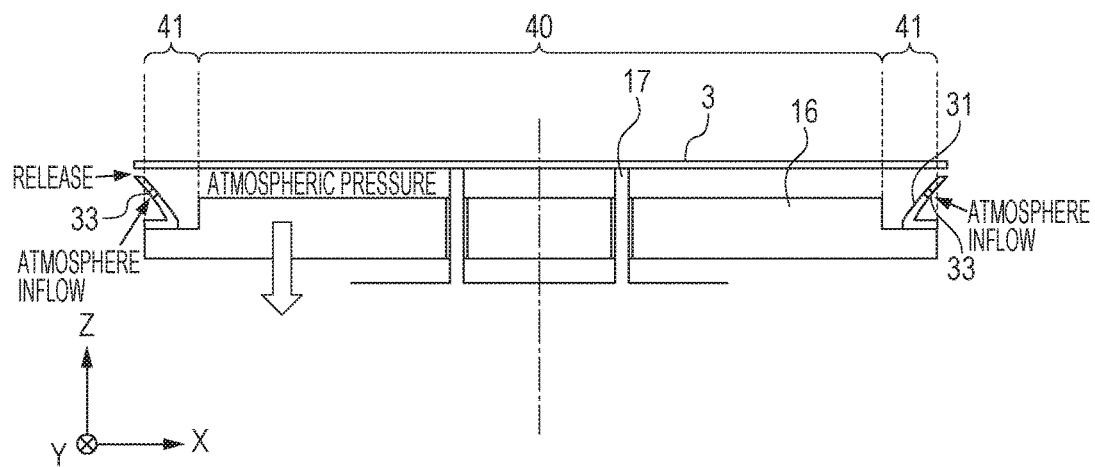
FIG. 8 illustrates a chuck according to a further embodiment.

It is only necessary that the open holes 33 should face the space 42 on one end (first end) and should face the atmosphere space on the other end (second end). For this reason, it is only necessary that the open holes 33 should be provided in one of the outer peripheral part of the chuck 16 and the lip seal 31. FIG. 8 illustrates a holding device 10 in which open holes 33 are provided on a lip seal 31.

While the lip seal 31 is directly fixed to the chuck 16 in FIG. 2, it may be fixed with a separate component to facilitate replacement thereof. The lip seal 31 may be divided into a distal end part including a portion in contact with the substrate 3 and the other part so that only the worn distal end part can be replaced.

The cross-sectional area of the open holes 33 preferably increases with an increasing distance from the center of the chuck 16. Since most of the space 42 lies on the outer peripheral part during attraction of the substrate 3, the substrate 3 is more easily separated from the lip seal 31 in a short time by preferentially supplying gas to the outer peripheral part. For example, when a center region and a region on an outer side of the center region are set on the substrate holding surface so as to have the same area and the same number of holes are provided in each of the regions, the total cross-sectional area of the holes in the outer region is preferably larger.

The open holes 33 do not necessarily need to be arranged at equal angular intervals. When the attraction holes 32 or the vacuum pump is disposed at a position biased relative to the chuck 16, the number of open holes 33 is preferably increased in a region where the density of the attraction holes 32 is low or a region which is far from the vacuum pump. Increasing the number of the open holes 33 could prevent the delay of supplying the air into the space 42.

In the holding device 10 having the lip seal 31, the substrate 3 is sometimes displaced by about 10 to 1000 μm in a predetermined direction before and after the substrate 3 is attracted. This results from individual differences and mounting errors caused in the manufacturing process of the lip seal 31. In this case, displacement is measured beforehand with the detection system 8 before the start of exposure, the correction amount is calculated by an operational circuit included in the control unit 18 or the like, and the stages 7 and 13 are scanned in consideration of the correction amount. This can reduce the displacement of the substrate 3 caused by the attracting operation, and can prevent the decrease in alignment accuracy.

Light applied from the lithography apparatus of the present invention onto the substrate 3 is not limited to the i-line (wavelength 365 nm). The light may be light in the far ultraviolet region, such as KrF light (wavelength 248 nm) or ArF light (wavelength 193 nm), or the g-line (wavelength 436 nm) serving as light in the visible region.

The lithography apparatus of the present invention may be an apparatus that forms a latent image pattern on a wafer by irradiating a substrate with a charged particle beam or an apparatus that forms a pattern on a substrate by an imprint method.

Article Production Method

A production method for an article (for example, a semiconductor integrated circuit element, a liquid crystal display element, an imaging element, a magnetic head, a CD-RW, an optical element, or a photomask) according to an embodiment of the present invention includes a step of exposing a substrate (for example, a wafer or a glass plate) with a pattern using a lithography apparatus, and a step of subjecting the exposed substrate to at least any one of an etching process and an ion implantation process. The production method may further include other known processing steps (for example, development, oxidation, film deposition, vapor deposition, planarization, resist stripping, dicing, bonding, and packaging).

The substrate holding device and the lithography apparatus according to the present invention are advantageous for separation of the substrate from the seal member in a short time.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2014/082986, filed Dec. 12, 2014, which is hereby incorporated by reference herein in its entirety.

The invention claimed is:

1. A substrate holding device configured to hold a substrate, the substrate holding device comprising:
    a holding member including a center part having a hole through which gas is exhausted from a space between the substrate and the holding member and an outer peripheral part surrounding the center part;
    a moving unit configured to relatively move the substrate and the holding member in a direction perpendicular to a substrate holding surface of the center part; and
    a seal member provided on the outer peripheral part, configured to seal the space and configured to be deformed in response to a distance between the substrate and the holding member relatively moved by the moving unit,
    wherein at least one of the outer peripheral part and the seal member has a through hole, and
    wherein a first end of the through hole faces the space and a second end of the through hole faces an atmosphere.

2. The substrate holding device according to claim 1, wherein the through hole is provided in the outer peripheral part along a thickness direction of the holding member.

3. The substrate holding device according to claim 1, wherein gas outside the space flows into the through hole from the second end toward the first end according to a pressure difference between the space and the atmosphere.

4. The substrate holding device according to claim 1, wherein the through hole is a first through hole, the center part has a second through hole provided independently of an exhaust system leading to the hole and facing the atmosphere, and a sum of cross-sectional areas of the first through hole and the second through hole in a direction along a substrate holding surface is 0.03% or less of a cross-sectional area of the space in the direction along the substrate holding surface.

5. The substrate holding device according to claim 4, wherein the sum of the cross-sectional areas of the first through hole and the second through hole in the direction along the substrate holding surface is within a range of 0.0005% to 0.004% of the cross-sectional area of the space in the direction along the substrate holding surface.

6. The substrate holding device according to claim 1, wherein the through hole is connected to a gas supply source, and the substrate holding device further includes a flow-rate control unit configured to control a flow rate of gas passing through the through hole by using an openable and closable valve provided between the through hole and the gas supply source.

7. The substrate holding device according to claim 1, wherein the through hole is provided in a lead-in area for the seal member on a substrate opposing surface of the outer peripheral part.

8. The substrate holding device according to claim 1, wherein the seal member is formed of an elastic polymer material.

9. The substrate holding device according to claim 1, wherein a distal end portion of the seal member contains a fluorine compound.

10. The substrate holding device according to claim 1, wherein under a condition where the substrate and the holding member are separated, height of the distal end portion of the seal member is higher than height of the substrate holding surface.

11. The substrate holding device according to claim 1, wherein under a condition where the substrate is arranged on the substrate holding surface and gas is exhausted through the hole, a pressure of the space is lower than an atmosphere.

12. The substrate holding device according to claim 1, wherein an upper surface of the outer peripheral part is lower than the substrate holding surface, and the seal member is arranged at upper surface of the outer peripheral part.

13. The substrate holding device according to claim 1, wherein height of the outer peripheral part is lower than that of the center part.

14. A substrate holding device configured to hold a substrate, the substrate holding device comprising:
    a holding member including a center part having a hole through which gas is exhausted from a space between the substrate and the holding member and an outer peripheral part surrounding the center part;
    a moving unit configured to relatively move the substrate and the holding member in a direction perpendicular to a substrate holding surface of the center part; and
    a seal member provided on the outer peripheral part, configured to seal the space and configured to be deformed in response to a distance between the substrate and the holding member relatively moved by the moving unit,
    wherein the outer peripheral part has a through hole,
    wherein a first end of the through hole faces the space and a second end of the through hole is connected to a pipe leading to an atmosphere, and
    wherein an openable and closable valve is provided in the pipe.

15. The substrate holding device according to claim 14, wherein the through hole is provided in the outer peripheral part along a thickness direction of the holding member.

16. The substrate holding device according to claim 14, wherein gas outside the space flows into the through hole from the second end toward the first end according to a pressure difference between the space and the atmosphere.

17. The substrate holding device according to claim 14, wherein the through hole is a first through hole, the center part has a second through hole provided independently of an exhaust system leading to the hole and facing the atmosphere, and a sum of cross-sectional areas of the first through hole and the second through hole in a direction along a substrate holding surface is 0.03% or less of a cross-sectional area of the space in the direction along the substrate holding surface.

18. The substrate holding device according to claim 17, wherein the sum of the cross-sectional areas of the first through hole and the second through hole in the direction along the substrate holding surface is within a range of 0.0005% to 0.004% of the cross-sectional area of the space in the direction along the substrate holding surface.

19. The substrate holding device according to claim 14, wherein the through hole is connected to a gas supply source, the openable and closable valve is provided between the through hole and the gas supply source, and the substrate holding device further includes a flow-rate control unit configured to control a flow rate of gas passing through the through hole by using the openable and closable valve.

20. The substrate holding device according to claim 14, wherein the through hole is provided in a lead-in area for the seal member on a substrate opposing surface of the outer peripheral part.

21. The substrate holding device according to claim 14, wherein the seal member is formed of an elastic polymer material.

22. The substrate holding device according to claim 14, wherein a distal end portion of the seal member contains a fluorine compound.

23. The substrate holding device according to claim 14, wherein height of the outer peripheral part is lower than that of the center part.

24. A lithography apparatus that radiates a beam onto a substrate and forms a pattern on the substrate, the lithography apparatus comprising:
a holding device configured to hold the substrate,
wherein the holding device includes
a holding member including a center part having a hole through which gas is exhausted from a space between the substrate and the holding member and an outer peripheral part surrounding the center part, a moving unit configured to relatively move the substrate and the holding member in a direction perpendicular to a substrate holding surface of the center part; and
a seal member provided on the outer peripheral part, configured to seal the space and configured to be deformed in response to a distance between the substrate and the holding member relatively moved by the moving unit, and
wherein at least one of the outer peripheral part and the seal member has a through hole, and
wherein a first end of the through hole faces the space and a second end of the through hole faces an atmosphere.

25. A method for manufacturing an item comprising:
radiating a beam onto a substrate by using a lithography apparatus; and
performing at least one of an etching operation and an ion implantation operation on the substrate,
wherein the lithography apparatus is a lithography apparatus that includes a holding device that holds the substrate and that radiates the beam onto the substrate and forms a pattern on the substrate,
wherein the holding device includes
a holding member including a center part having a hole through which gas is exhausted from a space between the substrate and the holding member and an outer peripheral part surrounding the center part,
a moving unit configured to relatively move the substrate and the holding member in a direction perpendicular to a substrate holding surface of the center part; and
a seal member provided on the outer peripheral part, configured to seal the space and configured to be deformed in response to a distance between the substrate and the holding member relatively moved by the moving unit, and
wherein at least one of the outer peripheral part and the seal member has a through hole, and
wherein a first end of the through hole faces the space and a second end of the through hole faces an atmosphere.

26. A lithography apparatus that radiates a beam onto a substrate and forms a pattern on the substrate, the lithography apparatus comprising:
a holding device configured to hold the substrate,
wherein the holding device includes
a holding member including a center part having a hole through which gas is exhausted from a space between the substrate and the holding member and an outer peripheral part surrounding the center part,
a moving unit configured to relatively move the substrate and the holding member in a direction perpendicular to a substrate holding surface of the center part; and
a seal member provided on the outer peripheral part, configured to seal the space and configured to be deformed in response to a distance between the substrate and the holding member relatively moved by the moving unit, and
wherein the outer peripheral part has a through hole,
wherein a first end of the through hole faces the space and a second end of the through hole is connected to a pipe leading to an atmosphere, and
wherein an openable and closable valve is provided in the pipe.

27. A method for manufacturing an item comprising:
radiating a beam onto a substrate by using a lithography apparatus; and
performing at least one of an etching operation and an ion implantation operation on the substrate,
wherein the lithography apparatus is a lithography apparatus that includes a holding device that holds the substrate and that radiates the beam onto the substrate and forms a pattern on the substrate,
wherein the holding device includes
a holding member including a center part having a hole through which gas is exhausted from a space between the substrate and the holding member and an outer peripheral part surrounding the center part,
a moving unit configured to relatively move the substrate and the holding member in a direction perpendicular to a substrate holding surface of the center part; and
a seal member provided on the outer peripheral part, configured to seal the space and configured to be deformed in response to a distance between the substrate and the holding member relatively moved by the moving unit, and,
wherein the outer peripheral part has a through hole,
wherein a first end of the through hole faces the space and a second end of the through hole is connected to a pipe leading to an atmosphere, and
wherein an openable and closable valve is provided in a pipe leading to the through hole.

28. A substrate holding device configured to hold a substrate, the substrate holding device comprising:
a holding member including a center part having a hole through which gas is exhausted from a space between the substrate and the holding member and an outer peripheral part provided at a position lower than the center part to surround the center part; and a seal member provided on the outer peripheral part to define the space, wherein at least one of the outer peripheral part and the seal member has a through hole independent of an exhaust system leading to the hole, wherein gas outside the space flows into the through hole from the second end toward the first end according to a pressure difference between the space and the outside space, and wherein the through hole is a first through hole, the center part has a second through hole provided independently of the exhaust system and facing the outside space, and a sum of cross-sectional areas of the first through hole and the second through hole in a direction along a substrate holding surface is 0.03% or less of a cross-sectional area of the space in the direction along the substrate holding surface.

29. The substrate holding device according to claim 28, wherein the sum of the cross-sectional areas of the first through hole and the second through hole in the direction along the substrate holding surface is within a range of 0.0005% to 0.004% of the cross-sectional area of the space in the direction along the substrate holding surface.

30. A substrate holding device configured to hold a substrate, the substrate holding device comprising:
- a holding member including a center part having a hole through which gas is exhausted from a space between the substrate and the holding member and an outer peripheral part provided at a position lower than the center part to surround the center part; and
- a seal member provided on the outer peripheral part to define the space,
- wherein the outer peripheral part has a through hole independent of an exhaust system leading to the hole,
- wherein a first end of the through hole faces the space and a second end of the through hole is connected to a pipe leading to an outside space,
- wherein an openable and closable valve is provided in the pipe, and
- wherein the through hole is a first through hole, the center part has a second through hole provided independently of the exhaust system and facing the outside space, and a sum of cross-sectional areas of the first through hole and the second through hole in a direction along a substrate holding surface is 0.03% or less of a cross-sectional area of the space in the direction along the substrate holding surface.

31. The substrate holding device according to claim 30, wherein the sum of the cross-sectional areas of the first through hole and the second through hole in the direction along the substrate holding surface is within a range of 0.0005% to 0.004% of the cross-sectional area of the space in the direction along the substrate holding surface.

32. A substrate holding device configured to hold a substrate, the substrate holding device comprising:
- a holding member including a center part having a hole through which gas is exhausted from a space between the substrate and the holding member and an outer peripheral part surrounding the center part;
- a moving unit configured to relatively move the substrate and the holding member in a direction perpendicular to a substrate holding surface of the center part; and
- a seal member provided on the outer peripheral part, configured to seal the space and configured to be deformed in response to a distance between the substrate and the holding member relatively moved by the moving unit,
- wherein the seal member has a through hole, and
- wherein a first end of the through hole faces the space and a second end of the through hole faces an atmosphere.

33. The substrate holding device according to claim 32, wherein height of the outer peripheral part is lower than that of the center part.

* * * * *